(12) United States Patent
Setsompop et al.

(10) Patent No.: US 8,076,939 B2
(45) Date of Patent: Dec. 13, 2011

(54) METHOD FOR FAST MAGNETIC RESONANCE RADIOFREQUENCY COIL TRANSMISSION PROFILE MAPPING

(75) Inventors: Kawin Setsompop, Cambridge, MA (US); Elfar Adalsteinsson, Belmont, MA (US); Vijayanand Alagappan, Aurora, OH (US); Lawrence Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 231 days.

(21) Appl. No.: 12/422,017

(22) Filed: Apr. 10, 2009

(65) Prior Publication Data

US 2010/0066361 A1    Mar. 18, 2010

Related U.S. Application Data

(60) Provisional application No. 61/043,776, filed on Apr. 10, 2008.

(51) Int. Cl.
  *G01V 3/00* (2006.01)
(52) U.S. Cl. ...................................... 324/309
(58) Field of Classification Search ........... 324/300–322
  See application file for complete search history.

(56) References Cited

U.S. PATENT DOCUMENTS

| | | | |
|---|---|---|---|
| 5,001,428 A * | 3/1991 | Maier et al. | 324/309 |
| 5,617,028 A * | 4/1997 | Meyer et al. | 324/320 |
| 6,965,232 B2 * | 11/2005 | Sodickson | 324/307 |
| 6,975,114 B1 * | 12/2005 | Ledden | 324/314 |
| 7,336,074 B2 * | 2/2008 | Yang et al. | 324/318 |
| 2003/0038632 A1 * | 2/2003 | Duensing et al. | 324/307 |
| 2003/0201775 A1 * | 10/2003 | Boskamp | 324/318 |
| 2004/0070394 A1 * | 4/2004 | Gonzalez Ballester et al. | 324/307 |
| 2005/0110488 A1 * | 5/2005 | Zhu | 324/309 |
| 2008/0100292 A1 * | 5/2008 | Hancu | 324/307 |
| 2008/0129294 A1 * | 6/2008 | Leussler | 324/318 |

OTHER PUBLICATIONS

Haacke et al., Magnetic Resonance Imaging: Physical Principles and Sequence Design, John Wiley & Sons, Inc. (1999).*
Katscher et al., Transmit SENSE, Magnetic Resonance in Medicine 49:144-150 (2003).*
Kerr et al., Accelerated B1 mapping for parallel excitation, Proceedings of the 15th Annual Meeting of ISMRM, Berlin, Germany (2007).*
Alagappan et al, Degenerate Mode Band-Pass Birdcage Coil for Accelerated Parallel Excitation, Magnetic Resonance in Medicine 57:1148-1158 (2007).

(Continued)

*Primary Examiner* — Melissa Koval
*Assistant Examiner* — Daniel Miller
(74) *Attorney, Agent, or Firm* — Quarles & Brady LLP

(57) ABSTRACT

A system and method for producing an image indicative of characteristics of a radiofrequency ("RF") coil with a magnetic resonance imaging ("MRI") system is disclosed. The method includes acquiring MR signals while performing a pulse sequence with the MRI system and driving the RF coil at a selected transmission power. This process is repeated a plurality of times to drive the RF coil at a different transmission powers during each repetition. A plurality of images are reconstructed from the acquired MR signals and an image indicative of RF reception characteristics of the RF coil is produced from the reconstructed images. Subsequently, an image indicative of RF transmission characteristics of the RF coil is produced using the image indicative of the RF receiver response. More specifically, only one data acquisition is necessary for each RF coil element to produce the image indicative of the RF transmission characteristics for that coil element.

12 Claims, 4 Drawing Sheets

OTHER PUBLICATIONS

Morrell et al, Three-Dimensional Spectral-Spatial Excitation, MRM 37:378-386 (1997).

Xu et al, A Noniterative Method to Design Large-Tip-Angle Multi-dimensional Spatially-Selective Radio Frequency Pulses for Parallel Transmission, MRM 58:326-334 (2007).

Vernickel et al, Eight Channel Transmit/Receive Body MRI Coil at 3T, MRM 58:381-389 (2007).

Setsompop et al, in vivo Parallel RF Excitation with B0 Correction, Proc. Intl. Soc. Mag. Reson. Med. 15 (2007), p. 671.

Griswold et al, Autocalibrated accelerated Parallel Excitation (Transmit-GRAPPA), Proc. Intl. Soc. Mag. Reson. Med. 13 (2005), p. 2435.

Katscher et al, Transmit SENSE, Magnetic Resonance in Medicine 49:144-150 (2003).

Zhu, Parallel Excitation with an Array of Transmit Coils, Magnetic Resonance in Medicine 51:775-784 (2004).

Ullmann et al, Experimental Analysis of Parallel Excitation Using Dedicated Coil Setups and Simultaneous RF Transmission on Multiple Channels, Magnetic Resonance in Medicine 54:994-1001 (2005).

Cunningham et al, Saturated Double-Angle Method for Rapid B1+ Mapping, Magnetic Resonance in Medicine 55:1326-1333 (2006).

Grissom et al, Spatial Domain Method for the Design of RF Pulses in Multicoil Parallel Excitation, Magnetic Resonance In Medicine 56:620-629 (2006).

Setsompop et al, Parallel RF Transmission with Eight Channels at 3 Tesla, Magnetic Resonance in Medicine 56:1163-1171 (2006).

Zhang et al, Reduction of Transmitter B1 Inhomogeneity With Transmit SENSE Slice-Select Pulses, Magnetic Resonance In Medicine 57:842-846 (2007).

Meyer et al, Simultaneous Spatial and Spectral Selective Excitation, Magnetic Resonance in Medicine 15, 287-304 (1990).

James Tropp, Reciprocity and Gyrotropism in Magnetic Resonance Transduction, Physical Review A 74, 062103 (2006).

Pauly et al, A k-Space Analysis of Small-Tip-Angle Excitation, Journal of Magnetic Resonance 81, 43-56 (1989).

Setsompop et al, Magnitude Least Squares Optimization for Parallel Radio Frequency Excitation Design Demonstrated at 7 Tesla With Eight Channels, Magnetic Resonance in Medicine 59:908-915 (2008).

* cited by examiner

US 8,076,939 B2

METHOD FOR FAST MAGNETIC RESONANCE RADIOFREQUENCY COIL TRANSMISSION PROFILE MAPPING

CROSS REFERENCE TO RELATED APPLICATIONS

This application is based on, claims the priority of, and incorporates by reference U.S. Provisional Patent Application Ser. No. 61/043,776, filed Apr. 10, 2008, and entitled "Method For Fast B1 Mapping of Multiple MR Transmit Coils."

STATEMENT REGARDING FEDERALLY SPONSORED RESEARCH

This invention was made with government support under Grant Nos. R01EB006847, R01EB000790, R01EB007942, and P41RR14075 awarded by the National Institute of Health. The United States Government has certain rights in this invention.

BACKGROUND OF THE INVENTION

The field of the invention is magnetic resonance imaging ("MRI") methods and systems. More particularly, the invention relates to the production of MRI systems.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Depending on the technique used, many MR scans currently used to produce medical images require many minutes to acquire the necessary data. The reduction of this scan time is an important consideration, since reduced scan time increases patient throughput, improves patient comfort, and improves image quality by reducing motion artifacts. Many different strategies have been developed to shorten the scan time.

One such strategy is referred to generally as "parallel imaging". Parallel imaging techniques use spatial information from arrays of RF receiver coils to substitute for the encoding that would otherwise have to be obtained in a sequential fashion using RF pulses and field gradients (such as phase and frequency encoding). Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image (in comparison to conventional k-space data acquisition) by a factor that in the most favorable case equals the number of the receiver coils.

Thus the use of multiple receiver coils acts to multiply imaging speed, without increasing gradient switching rates or RF power.

Two categories of such parallel imaging techniques that have been developed and applied to in vivo imaging are SENSE (Sensitivity Encoding) and SMASH (Simultaneous Acquisition of Spatial Harmonics). With SENSE, the undersampled k-space data is first Fourier transformed to produce an aliased image from each coil, and then the aliased image signals are unfolded by a linear transformation of the superimposed pixel values. With SMASH, the omitted k-space lines are filled in or reconstructed prior to Fourier transformation, by constructing a weighted combination of neighboring lines acquired by the different receiver coils. SMASH requires that the spatial sensitivity of the coils be determined, and one way to do so is by "autocalibration" that entails the use of variable density k-space sampling.

A more recent advance to SMASH techniques using autocalibration is a technique known as GRAPPA (Generalized Autocalibrating Partially Parallel Acquisitions), introduced by Griswold et al. Using these GRAPPA techniques, lines near the center of k-space are sampled at the Nyquist frequency (in comparison to the greater spaced lines at the edges of k-space). These so-called autocalibration signal ("ACS") lines are then used to determine the weighting factors that are used to reconstruct the missing k-space lines. In particular, a linear combination of individual coil data is used to create the missing lines of k-space. The coefficients for the combination are determined by fitting the acquired data to the more highly sampled data near the center of k-space.

Most MRI scanners use a single-channel RF excitation coil to tip the spin magnetization away from its equilibrium state and initiate a measurement cycle. Usually, an RF excitation pulse is used to excite either all of the spins inside the excitation coil (non-selective excitation), a single slice through the subject (slice-selective excitation), or within only a specific region, such as, a small cube (3-D spatially-selective excitation). In spatially-selective, spatially-tailored excitation, the RF pulse is played out in the presence of gradient waveforms that impart a gradient onto the main magnetic field of the MRI system, which is instrumental in the spatial and selective excitation process. In general, the gradient field may be viewed as causing the traversal of a curve in excitation k-space, a path that may proceed through all three dimensions of k-space ($k_x$, $k_y$, and $k_z$), which under certain assumptions is essentially a 3D Fourier domain. During this traversal of excitation k-space, the energy of the RF pulse being played in conjunction with the gradient waveforms may be viewed as depositing RF energy along this k-space excitation trajectory curve. The RF pulse thus produces an excitation that modulates (in phase, in amplitude, or both) as a function of position ($k_x$, $k_y$, and $k_z$) in excitation k-space. The resulting excitation is often closely related to the inverse Fourier transform of this deposited energy.

For example, in a typical slice-selective RF pulse, a constant gradient field is applied in the z-direction while an RF pulse shaped like a sine cardinal ("sinc") function is transmitted through the MRI system's single excitation coil. In this instance, the gradient field causes the RF pulse energy to be deposited along a single line (a "spoke") in the $k_z$-direction of excitation k-space, that is, a line through the k-space position $(0,0,k_z)$. This sinc-like deposition in $k_z$ excites only those magnetic spins within a thin slice of tissue due to the Fourier relationship between energy deposited in excitation k-space and the flip angle of the resulting magnetization. In short, the magnetization that results from this typical RF pulse is a constant degree of excitation within the slice and no excitation out of the slice.

Recent work has extended this slice-selective concept to all three spatial dimensions, in which not only a thin slice is excited, but a particular pattern within the slice itself is excited. These "spatially-tailored" excitations in 2D and 3D require lengthy application of the RF excitation and associated gradients. A recent method, termed "parallel transmission" (and sometimes referred to as "parallel excitation"), exploits variations among the different spatial profiles of a multi-element RF coil array. This permits sub-sampling of the gradient trajectory needed to achieve the spatially-tailored excitation and this method has been shown in many cases to dramatically speed up, or shorten, the corresponding RF pulse.

This "acceleration" of the spatially-tailored RF excitation process makes the pulse short enough in duration to be clinically useful. Accelerations of 4 to 6 fold have been achieved via an 8 channel transmit system as disclosed by K. Setsompop, et al., in "Parallel RF Transmission with Eight Channels at 3 Tesla," *Magnetic Resonance in Medicine;* 2006, 56:1163-1171. This acceleration enables several important applications, including flexibly shaped excitation volumes and mitigation of RF field inhomogeneity at high field for slice or slab-selective pulses. A number of methods have been proposed for the design of the RF and gradient waveforms for parallel excitation, such as those disclosed, for example, by U. Katscher, et al., in "Transmit SENSE," *Magnetic Resonance in Medicine;* 2003, 49:144-150; by Y. Zhu in "Parallel Excitation with an Array of Transmit Coils," *Magnetic Resonance in Medicine;* 2004, 51:775-784; by M. Griswold, et al., in "Autocalibrated Accelerated Parallel Excitation (Transmit-GRAPPA)," *Proceedings of the 13th Annual Meeting of ISMRM;* 2005, 2435; and by W. Grissom, et al., in "Spatial Domain Method for the Design of RF Pulses in Multicoil Parallel Excitation," *Magnetic Resonance in Medicine;* 2006, 56:620-629.

Successful implementations have been demonstrated on multi-channel hardware, including those described by P. Ullmann, et al., in "Experimental Analysis of Parallel Excitation Using Dedicated Coil Setups and Simultaneous RF Transmission on Multiple Channels," *Magnetic Resonance in Medicine;* 2005, 54:994-1001; by D. Xu, et al., in "A Noniterative Method to Design Large-Tip-Angle Multidimensional Spatially-Selective Radio Frequency Pulses for Parallel Transmission," *Magnetic Resonance in Medicine;* 2007, 58:326-334; and by P. Vernickel, et al., in "Eight-Channel Transmit/Receive Body MRI Coil at 3T," *Magnetic Resonance in Medicine;* 2007, 58:381-389.

Parallel transmission methods allow for a large reduction in duration of the spatially-tailored RF excitation pulses by utilizing the extra degrees of freedom gained from having many, instead of one single, transmit RF coil. One of the main hurdles in bringing this technology into clinical use, however, is in finding a fast, robust, and reliable technique for the acquisition of the transmission profiles of RF coils ("$B_1^+$ maps"), which serve as a crucial input to the excitation pulse design calculation. Several quantitative methods have been proposed for mapping the $B_1^+$ profile. One such method is the so-called double-angle method ("DAM"), which acquires data from two transmission voltages and is described, for example, by R. Stollberger and P. Wach, in "Imaging of the Active B1 Field In Vivo," *Magnetic Resonance in Medicine;* 1996, 35:246-251. Recently, a faster technique that improves on DAM, and based on the use of magnetization saturation pulses, has been proposed. Such a method is described, for example, by C. H. Cunningham, et al., in "Saturated Double-Angle Method for Rapid $B_1^+$ Mapping," *Magnetic Resonance in Medicine;* 2006, 55:1326-1333.

However, due to the large $B_1^+$ dynamic range of the local transmission coils, measurements at several transmission voltages from each of the transmission coils are required. This results in a time consuming $B_1^+$ mapping process, especially for systems with a large number of transmission coils. Additionally, the large dynamic range of the profiles for the local transmission coils in the parallel transmission setup can result in inaccurate results when employing current $B_1^+$ mapping methods.

It would therefore be desirable to provide a method for mapping the $B_1^+$ profile of a radiofrequency ("RF") coil having a plurality of transmission coil elements that is not only computationally fast, but is accurate over a range of magnetic field strengths and number of transmission coil elements.

SUMMARY OF THE INVENTION

The present invention is a method for obtaining the $B_1^+$ profile maps using an estimation of the RF coil array's synthesized mode receive profile. Instead of directly performing quantitative $B_1^+$ mapping on each of the transmit coils, the present invention first estimates a synthesized receive profile, that is, the density-weighted $B_1^-$ profile of the receive coil array. Once this receive profile is estimated, a single low voltage measurement is acquired from each of the transmission coils for the estimation of the individual $B_1^+$ transmission profiles. Therefore, the total data acquisition time in this method is much shorter than in previous techniques, especially for systems with large number of transmission coils.

It is an aspect of the invention to provide a method that shortens the scan time required to produce $B_1^+$ profile maps for parallel transmission RF coils. The estimation of the synthesized receive profile requires only a few measurements because a synthesized transmission mode with a low dynamic range (for example the uniform mode, or "mode-1", of a birdcage coil) can be used for transmission in this estimation process. Only a single measurement of each transmission coil is then needed to acquire sufficient data to produce the $B_1^+$ transmission profiles.

It is another aspect of the invention to provide a method for reducing the specific absorption ratio ("SAR") in a subject undergoing a magnetic resonance imaging ("MRI") study. Magnetization saturation pulses are needed only for determining the uniform mode's receive profile, and this greatly reduces the amount of deposited RF energy required to produce individual transmission RF coil profiles.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
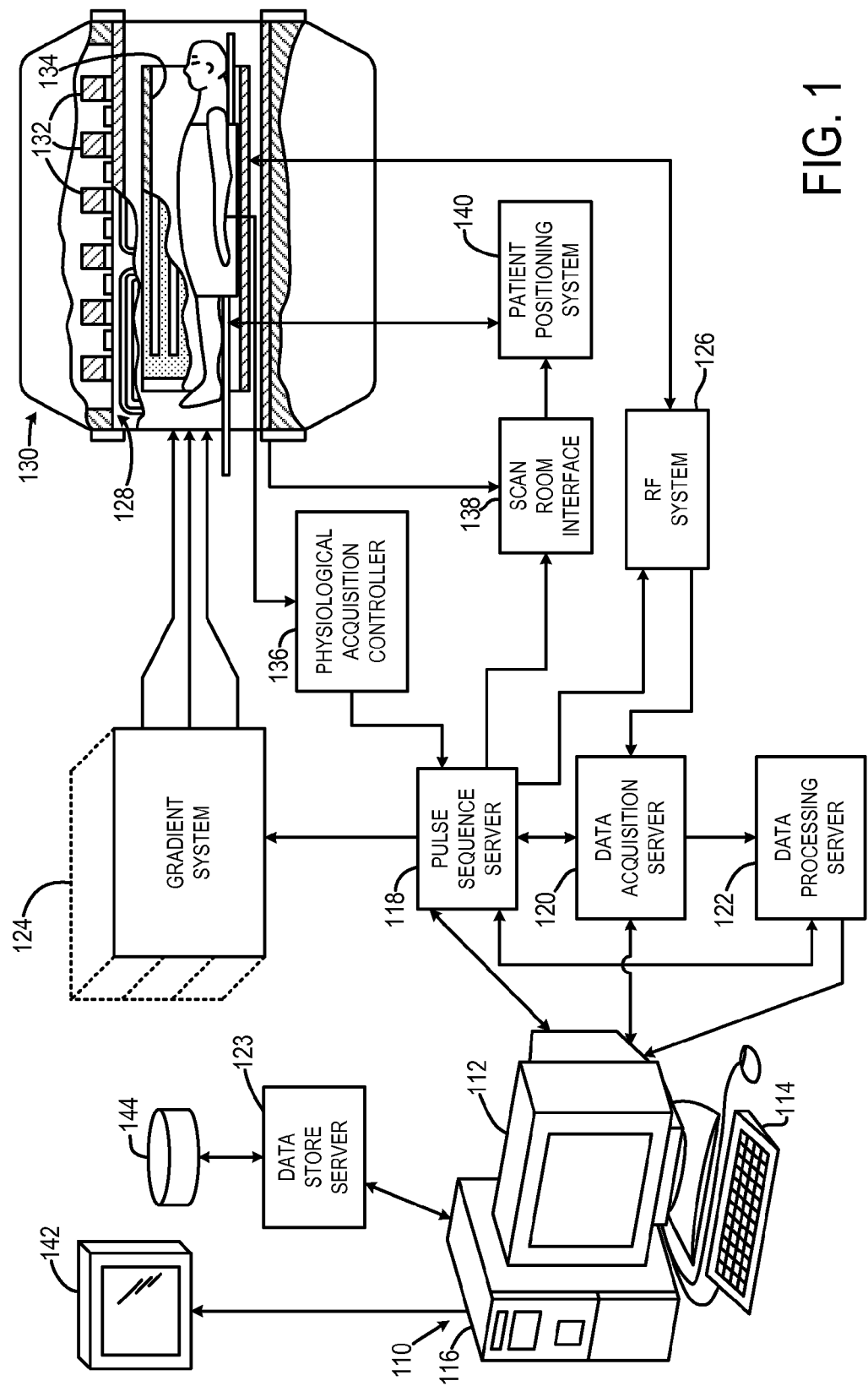
FIG. 1 is a block diagram of a magnetic resonance imaging ("MRI") system that employs the present invention.

Referring particularly to FIG. 1, the preferred embodiment of the invention is employed in an MRI system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and an RF system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad \text{Eqn. (1);}$$

and the phase of the received MR signal may also be determined:

$$\phi = \tan^{-1}\left(\frac{Q}{I}\right). \qquad \text{Eqn. (2)}$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
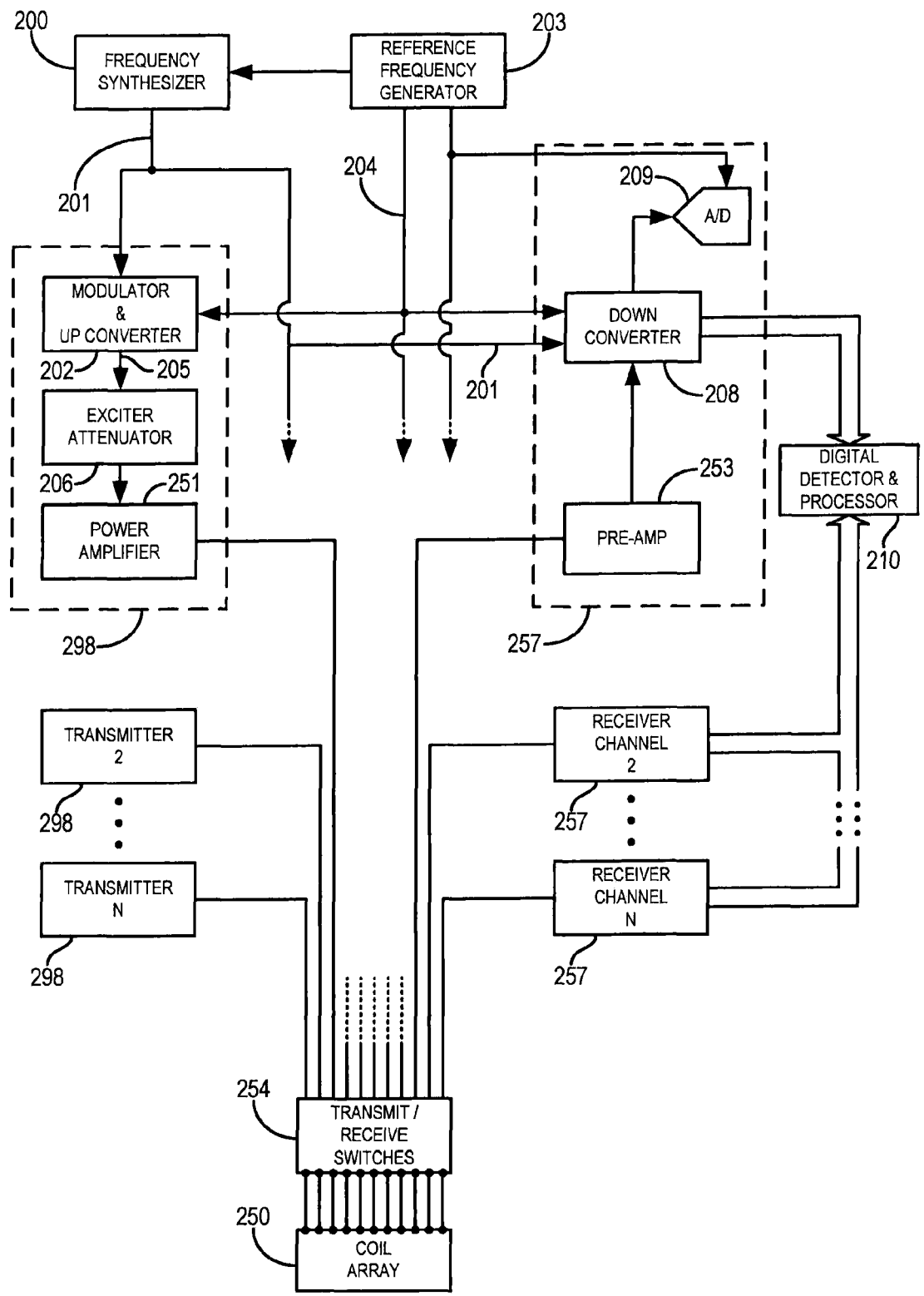
FIG. 2 is a block diagram of a radiofrequency ("RF") system that forms part of the MRI system of FIG. 1.

Referring particularly to FIG. 2, the present invention employs a coil array 250 that includes a plurality of coil elements that can be separately driven by a plurality of RF transmitters to produce the prescribed radiofrequency ("RF") field of excitation ("FOX"). The same coil array 250 can also be used with a plurality of receive channels, or in the alternative, the whole body RF coil 134 or a local RF coil can be used to acquire the MR signals. Many different coil array structures 250 may be used with the present invention, which maps the $B_1^+$ RF excitation field produced by each coil array element.

Referring particularly to FIG. 2, the RF system 126 includes a set of transmitters 298 that each produce a prescribed RF excitation field. The base, or carrier, frequency of this RF excitation field is produced under control of a frequency synthesizer 200 which receives a set of digital signals from the pulse sequence server 118. These digital signals indicate the frequency and phase of the RF carrier signal produced at an output 201. The RF carrier is applied to a modulator and up converter 202 in each transmitter 298 where its amplitude is modulated in response to a signal also received from the pulse sequence server 118. The signal defines the envelope of the RF excitation pulse to be produced and is produced by sequentially reading out a series of stored digital values. These stored digital values may, be changed to enable any desired RF pulse envelope to be produced by each transmitter 298.

The magnitude of the RF excitation pulse produced at output 205 is attenuated by an exciter attenuator circuit 206 in each transmitter 298 which receives a digital command from the pulse sequence server 118. The attenuated RF excitation pulses are applied to a power amplifier 251 in each transmitter 298. The power amplifiers are current source devices that connect to respective transmit inputs on a set of transmit/receive switches 254. By way of example, N transmitters 298 are employed and connected through N transmit/receive switches 254 to N coil elements in an RF coil array 250.

Referring still to FIG. 2 the signal produced by the subject is picked up by the coil array 250 and applied to the inputs of a set of receive channels 257. A pre-amplifier 253 in each receiver channel 257 amplifies the signal by an amount determined by a digital attenuation signal received from the pulse sequence server 118. The received signal is at or around the Larmor frequency, and this high frequency signal is down converted in a two step process by a down converter 208 which first mixes the NMR signal with the carrier signal on line 201 and then mixes the resulting difference signal with a reference signal on line 204. The down converter NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output to the data acquisition server 120. The reference signal as well as the sampling signal applied to the A/D converter 209 are produced by a reference frequency generator 203.

The transmit/receive switches 254 are operated by the pulse sequence server 118 to connect the N transmitters 298 to the N coil elements in the coil array 250 during those parts of the pulse sequence in which an RF field is to be produced. Each transmitter 298 is separately controlled by the pulse sequence server 118 to produce an RF field of a prescribed amplitude, frequency, phase and envelope at each of the N coil elements. The combined RF fields of the N coil elements produce the prescribed $B_1$ field throughout the region of interest in the subject during the imaging phase of the procedure.

When the $B_1$ field is not produced the pulse sequence server 118 operates the transmit/receive switches 254 to connect each of the N receive channels 257 to the respective N coil elements. Signals produced by excited spins in the subject are picked up and separately processed as described above.

Figure 3:
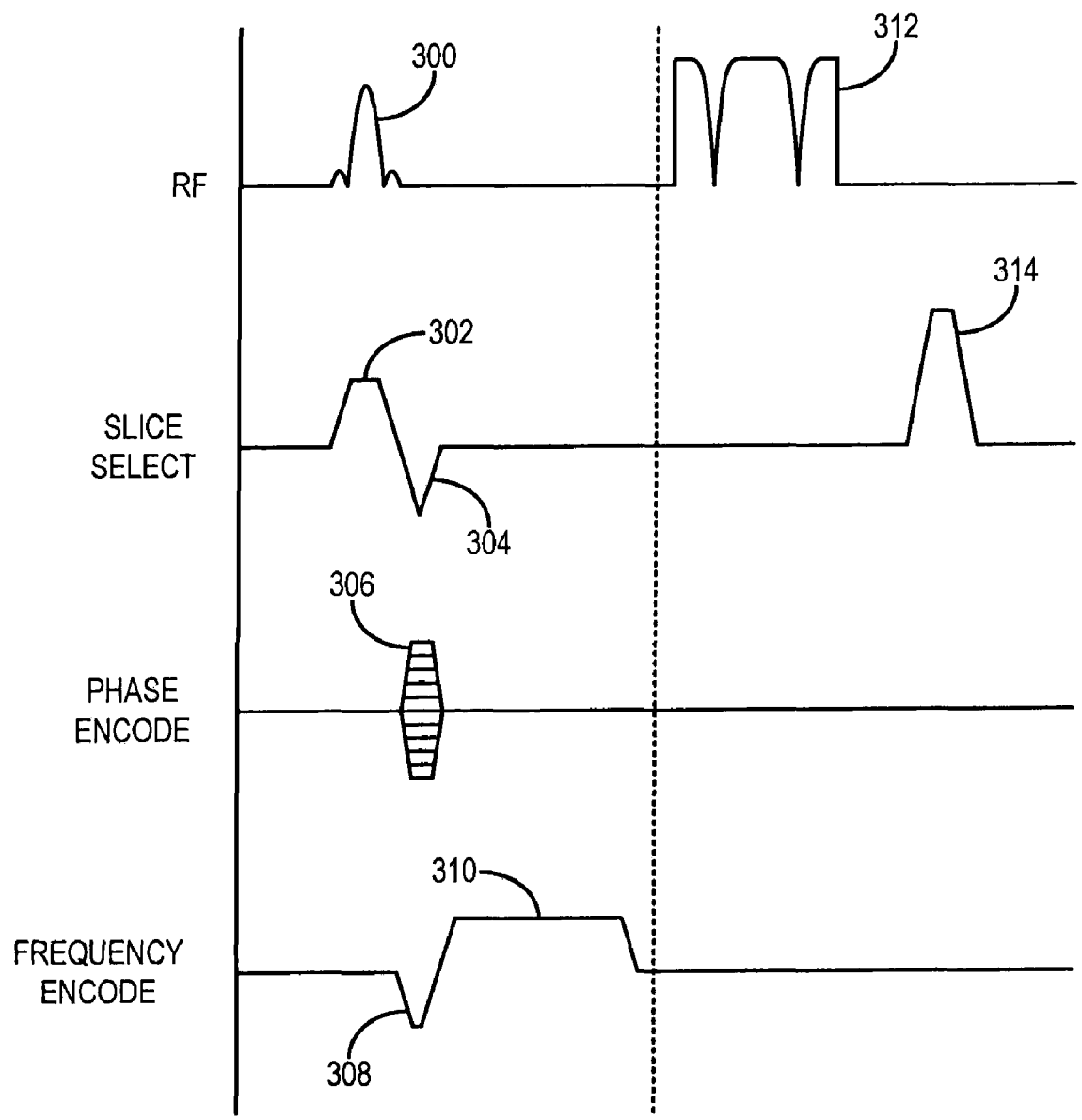
FIG. 3 is a pictorial representation of a pulse sequence performed by the MRI system of FIG. 1 when practicing an embodiment the present invention.

Turning now to FIG. 3, a modified gradient-recalled echo ("GRE") pulse sequence is shown that is employed to practice the present invention. The GRE pulse sequence is appended with a reset module that acts to saturate the spins. The GRE portion of the pulse sequence begins with the application of a RF excitation pulse 300 in the presence of a slice selective gradient 302. The amplitude and duration of the RF excitation pulse 300 are chosen such that a desired flip angle, θ, is enforced upon the excited spins. To mitigate signal loss resulting from phase dispersions introduced by the slice selective gradient 302, a rephasing lobe 304 is applied after the slice selective gradient 302. Phase encoding is then performed through the application of a phase encoding gradient 306. As is well-known in the art, the magnitude of a phase encoding gradient pulse is determined by the integral of its amplitude over its duration (i.e., its area). In most pulse sequences the duration is kept constant and the phase encoding pulse magnitude is stepped through its value by changing its amplitude. A dephasing gradient 308 is applied in the frequency encoding direction prior to readout. This causes the spins lying in the transverse plane to dephase such that when the readout gradient 310 is applied, they rephase and form a detectable free-induction decay signal. A $B_1$-independent rotation ("BIR") adiabatic excitation pulse 312 is then applied to saturate the remaining longitudinal magnetization in the transverse plane. In the preferred embodiment, a BIR-4 adiabatic pulse is employed. In the alternative, however, other pulses may be employed to saturate the magnetization, such as a composite pulse train. The BIR-4 pulse 312 is employed because of its insensitivity to $B_1^+$ field inhomogeneities. Dephasing of the transverse magnetization then occurs through the application of a spoiler gradient 314. It should be appreciated by those skilled in the art that other pulse sequences can be employed when practicing the present invention. For example, an echo-planar imaging ("EPI") pulse sequence may be employed.

In general, the image intensity of an image acquired with a GRE pulse sequence that employs an RF excitation pulse with flip angle, θ, is given by:

$$I(\bar{r}) = K\rho(\bar{r}) \frac{(1 - e^{-TR/T_1(\bar{r})})\sin\theta}{1 - e^{-TR/T_1(\bar{r})}\cos\theta}; \quad \text{Eqn. (3)}$$

where $I(V,\bar{r})$ is the image intensity, K is a proportionality constant, $\rho(\bar{r})$ is a spin density, TR is the sequence repetition time, $T_1(\bar{r})$ is the longitudinal relaxation time constant, θ is the flip angle, and $\bar{r}$ is a spatial position. The above relationship changes, however, when the RF transmission ("TX") and reception ("RX") profiles are non-uniform, and when accounting for the RF transmission voltage. In the latter situation, the image intensity is instead given by:

$$I(V, \bar{r}) = \rho(\bar{r}) \cdot RX(\bar{r}) \cdot \frac{(1 - e^{-TR/T_1(\bar{r})}) \cdot \sin\theta(V, \bar{r})}{1 - e^{-TR/T_1(\bar{r})} \cdot \cos\theta(V, \bar{r})}; \quad \text{Eqn. (4)}$$

where $RX(\bar{r})$ is the receive coil profile and V is the applied transmit voltage. As mentioned above, the amplitude and duration of an RF excitation pulse determine the flip angle; however, a more accurate representation of the relationship for a flip angle produced by a non-uniform transmission profile is given by:

$$\theta(V, \bar{r}) = \gamma \cdot TX(\bar{r}) \cdot V \cdot \int_0^T RF(t) dt; \quad \text{Eqn. (5)}$$

where γ is the gyromagnetic ratio of a spin species and RF(t) is a function that describes the RF excitation pulse. When the pulse sequence described above, with reference to FIG. 3, is employed the relationship describing image intensity changes, resulting from the application of the BIR-4 excitation pulse 312 and subsequent spoiler gradient 314. When performing such a pulse sequence, the image intensity is given by:

$$I(V,\bar{r}) = \rho(\bar{r}) \cdot RX(\bar{r}) \cdot (1 - e^{-TSR/T_1(\bar{r})}) \cdot \sin\theta(V,\bar{r}) \quad \text{Eqn. (6);}$$

where TSR is the saturation recovery time, which is the time that passes between the application of the spoiler gradient 314 and the next RF excitation 300, demarcating the subsequent repetition of the pulse sequence.

Since the transmit, $B_1^+$, and receive, $B_1^-$, magnetic patterns are of opposite circular polarizations and are different at high $B_0$ fields, the use of a quantitative coil profile mapping technique is required to obtain the coil array reception profile. Utilizing the relationships in Eqns. (4), (5), and (6) above, $B_1^+$ maps of multiple transmit coils can be produced in less time than provided by previous methods. Instead of directly performing quantitative $B_1^+$ mapping on each of the individual transmit coils, the present invention employs a synthesized coil array reception profile, $B_1^-$, to hasten the $B_1^+$ mapping process. Throughout the process, the synthesized reception profile, $B_1^-$, from the same receiver coil combination is used. Preferably, a coil having a uniform receive profile is employed; however, this is difficult to achieve at higher magnetic field strengths. As a result, a receive coil is operated such that the reception mode of the coil does not exhibit a signal null spot. For a birdcage coil, the uniform reception mode ("mode-1") satisfies this condition and is therefore preferably employed by the present invention. In the alternative, other types of coil array can be employed and driven in a manner that produced a reception profile having substantially no null spots.

Figure 4:
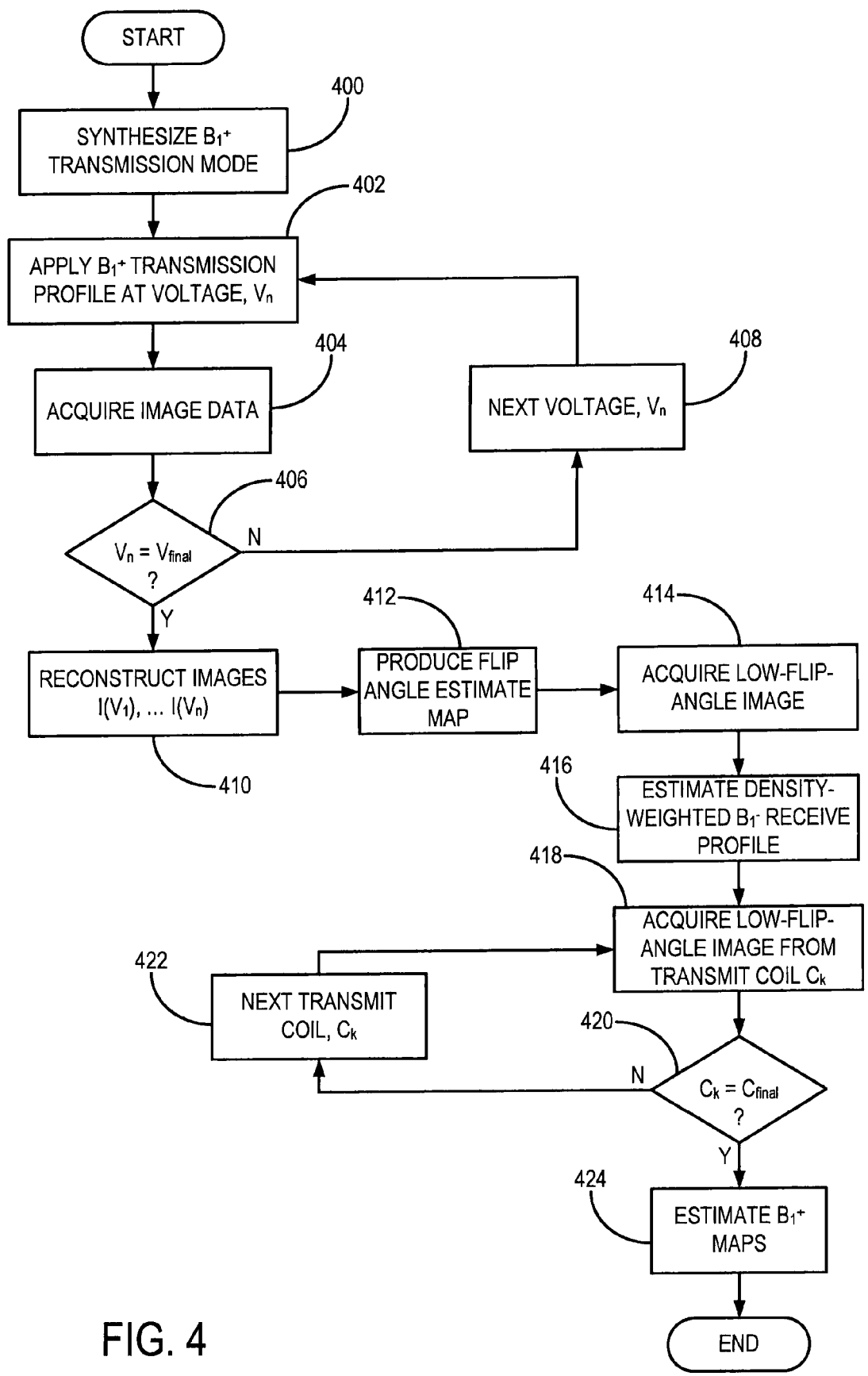
FIG. 4 is a flowchart setting forth the steps of an embodiment of the present invention.

Referring now particularly to FIG. 4, an embodiment of the $B_1^+$ mapping process of the present invention begins generally by first estimating a reception profile in steps 400-416. This estimated reception profile is subsequently employed to perform a rapid $B_1^+$ profile mapping of all of the transmission coil elements (or modes of the RF transmission coil) in steps 418-424. To this end, a $B_1^+$ transmission mode of the coil array is first synthesized, as indicated at step 400. More specifically, a $B_1^+$ transmission mode having a low dynamic range is synthesized, such that only a small number of $B_1^+$ transmission voltages need be employed when mapping a flip angle estimate map. Then, the imaging pulse sequence described above, with reference to FIG. 3, is performed while driving the RF excitation from the transmission coil array at a selected transmission voltage. Image data is acquired from the resulting MR signals, as indicated at step 404. A loop is then entered into at 406, in which additional image data is acquired by selecting a different transmission voltage at step 408 and repeating steps 402 and 404.

When all of the preselected transmission voltages have been employed the process continues to step 410, where images are reconstructed from each of the acquired sets of image data. The number of transmission voltages employed is related to the uniformity of the $B_1^+$ profile synthesized above in step 400. In general, a more uniform synthesized $B_1^+$ profile requires a fewer number of transmission voltages. The reasoning for this can be explained as follows. The transmission voltages are, in effect, different sampling points of a sinusoidal relationship between the image intensity values of the images reconstructed in step 410 and the flip angle resulting from an RF excitation pulse applied at the selected transmission voltage using the synthesized $B_1^+$ profile. Therefore, if the $B_1^+$ profile is substantially uniform, only a small number of sampling points is required since there is little variation in the profile. Similarly, the range of values selected for the transmission voltages relates to the average amplitude of the synthesized $B_1^+$ profile. For example, it is be desirable to employ a set of transmission voltages having a lower range of values for a $B_1^+$ profile having a higher average amplitude. The maximum transmission voltage value is therefore selected such that the range of transmission voltages adequately and accurately sample this sinusoidal relationship. These images are then fit to Eqn. (6) using a nonlinear search algorithm, as indicated at step 412. As a result, a flip angle estimate map, $\theta(V,\bar{r})$, is produced. Now, using a conventional GRE pulse sequence without the BIR-4 excitation pulse 312 and the spoiler gradient 314, and with a low-flip-angle RF excitation pulse 300, image data is acquired. A low-flip-angle image is subsequently reconstructed in step 414. When the flip angle is substantially small, the cosine of said flip angle is approximately equal to one. Therefore, the image intensity given by Eqn. (4) for a low-flip-angle image can be approximated as:

$$I(V,\bar{r}) = \rho(\bar{r}) \cdot RX(\bar{r}) \cdot \sin\theta(V,\bar{r}) \qquad \text{Eqn. (7)}.$$

Utilizing this approximation, the density-weighted reception profile, $\rho(\bar{r}) \cdot RX(\bar{r})$, can be determined, as indicated in step 416. This is done simply by dividing the low-flip-angle image by the sine of the flip angle map produced in step 412. Having now determined the density-weighted reception profile of the coil array, an estimation of the individual coil transmission profiles can be performed.

First, and again employing a conventional GRE pulse sequence with a low-flip-angle RF excitation, a low-flip-angle image is produced for an individual transmit coil, as indicated in step 418. A loop is entered at decision block 420 in which a low-flip-angle image is produced for each transmit coil in the coil array; each subsequent coil being selected in step 422. In the alternative, a low-flip-angle image can be produced for a plurality of individual transmit modes. The $B_1^+$ map for each transmission coil is then estimated, as indicated at step 424. First, a flip angle map is produced for each coil by rearranging Eqn. (7) as follows:

$$\theta(V,\bar{r}) = \sin^{-1}\left(\frac{I(V,\bar{r})}{\rho(\bar{r}) \cdot RX(\bar{r})}\right); \qquad \text{Eqn. (8)}$$

Here, the low-flip-angle image, $I(V,\bar{r})$, for each coil is divided by the density-weighted reception profile, $\rho(\bar{r}) \cdot RX(\bar{r})$, and the inverse sine of the result is calculated. From the flip angle maps, $\theta(V,\bar{r})$, and using Eqn. (5) above, the $B_1^+$ map for each transmission coil is then calculated. Specifically, Eqn. (5) can be rearranged as:

$$TX(\bar{r}) = \frac{\theta(V,\bar{r})}{\gamma \cdot V \cdot \int_0^T RF(t)\,dt}. \qquad \text{Eqn. (9)}$$

This $B_1^+$ map, given by $TX(\bar{r})$, is indicative of the transmission characteristic of the particular RF coil. Specifically, the $B_1^+$ map indicated the spatial sensitivity of the RF coil when operating to transmit RF energy.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing, with a magnetic resonance imaging (MRI) system, an image indicative of a radiofrequency (RF) coil characteristic for each RF coil in an RF coil array, the steps comprising:
   a) producing with the MRI system, a single density weighted reception profile for the entire RF coil array;
   b) acquiring, with the MRI system, image data corresponding to a single image while driving one of the RF coils in the RF coil array at a selected transmission voltage, wherein acquiring the image data includes acquiring a single voltage measurement from the one of the RF coils driven at the selected transmission voltage;
   c) repeating step b) for each RF coil in the RF coil array;
   d) reconstructing an image for each RF coil in the RF coil array from the image data acquired in steps b) and c); and
   e) producing a transmission profile map for each RF coil in the RF coil array using the density weighted reception profile produced in step a) and the respective image for each RF coil reconstructed in step d).

2. The method as recited in claim 1 in which step a) includes synthesizing a transmission mode profile for the RF coil array and acquiring a plurality of image data sets, each of the plurality of image data sets being acquired when driving the RF coil array at a different transmission voltage using the synthesized transmission mode profile.

3. The method as recited in claim 2 in which the transmission voltage at which the RF coil array is driven in step a) is selected using information related to the synthesized transmission mode profile.

4. The method as recited in claim 3 in which the information related to the synthesized transmission mode profile is at least one of a uniformity of the synthesized transmission mode profile and an average amplitude of the synthesized transmission mode profile.

5. The method as recited in claim 2 in which the synthesized transmission mode profile corresponds to a mode having substantially low spatial variation.

6. The method as recited in claim 2 in which step a) includes acquiring additional image data while driving the RF coil array using the synthesized transmission profile mode, and reconstructing a low flip-angle image from the acquired additional image data.

7. The method as recited in claim 6 in which step a) further includes producing a flip angle map indicative of the RF coil array by reconstructing images from the acquired plurality of image data sets and fitting the reconstructed images to a signal model that relates image intensity to flip angle.

8. The method as recited in claim 7 in which step a) further includes producing the density weighted reception profile by dividing the reconstructed low flip-angle image by a sine of the produced flip angle map.

9. The method as recited in claim 1 in which the images reconstructed in step d) are low flip-angle images.

10. The method as recited in claim 1 in which step e) includes producing a flip angle map for each RF coil in the RF coil array by dividing the respective low flip-angle image for each RF coil by the density weighted reception profile and calculating an inverse sine of the result.

11. The method as recited in claim 10 in which each respective flip angle map produced in step e) is used to produce the transmission profile map for the respective RF coil in the RF coil array.

12. The method as recited in claim 11 in which the transmission profile map for each RF coil in the RF coil array is produced in accordance with the following relationship:

$$TX(\bar{r}) = \frac{\theta(V, \bar{r})}{\gamma \cdot V \cdot \int_0^T RF(t)\,dt};$$

wherein:
 TX($\bar{r}$) is the transmission profile map;
 $\theta(V,\bar{r})$ is the flip angle map produced in step e);
 $\gamma$ is a gyromagnetic ratio;
 V is the transmission voltage;
 RF(t) is an RF excitation pulse; and
 T is a duration of the RF excitation pulse.

* * * * *

UNITED STATES PATENT AND TRADEMARK OFFICE
CERTIFICATE OF CORRECTION

| | | |
|---|---|---|
| PATENT NO. | : 8,076,939 B2 | Page 1 of 1 |
| APPLICATION NO. | : 12/422017 | |
| DATED | : December 13, 2011 | |
| INVENTOR(S) | : Setsompop et al. | |

It is certified that error appears in the above-identified patent and that said Letters Patent is hereby corrected as shown below:

Claim 6, column 12, line 60, "svnthesized" should be --synthesized--.

Signed and Sealed this
Seventh Day of February, 2012

David J. Kappos
*Director of the United States Patent and Trademark Office*